United States Patent [19]

Henkels

[11] 4,028,714
[45] June 7, 1977

[54] ULTRALOW-POWER, MICRO-MINIATURIZED JOSEPHSON DEVICES HAVING HIGH INDUCTANCE

[75] Inventor: Walter H. Henkels, Putnam Valley, N.Y.

[73] Assignee: International Business Machines Corporation, Armonk, N.Y.

[22] Filed: Dec. 31, 1974

[21] Appl. No.: 537,802

[52] U.S. Cl. .................. 357/5; 307/212; 307/245; 307/277; 307/306
[51] Int. Cl.² .................. H01L 39/22; H01L 27/18
[58] Field of Search ............ 357/5; 307/306, 212, 307/245, 277

[56] References Cited

UNITED STATES PATENTS

| 3,363,200 | 1/1968 | Jaklevic et al. | 357/5 |
| 3,533,018 | 10/1970 | Jaklevic et al. | 357/5 |
| 3,676,718 | 7/1972 | Anderson et al. | 357/5 |
| 3,705,393 | 12/1972 | Anacker et al. | 307/306 X |

OTHER PUBLICATIONS

Fulton et al., "Quantum Interference . . . Double Josephson Junctions," Phys. Rev. B., vol. 6, No. 3, Aug. 1, 1972, pp. 855–875.
Zappe, "Single Flux Quantum . . . Memory . . . ," Appl. Phys. Lett, vol. 25, No. 7, Oct. 1, 1974, pp. 424–426.

Primary Examiner—William D. Larkins
Attorney, Agent, or Firm—Thomas J. Kilgannon, Jr.

[57] ABSTRACT

Superconducting devices comprising at least a pair of Josephson tunneling junctions and means for providing a large kinetic inductance interconnecting the pair of Josephson junctions are disclosed. The kinetic inductance is obtained by providing, as a portion of the device, a superconducting element having a thickness much less than its penetration depth. The high inductance devices provided by this means permit an overall increase in device packing density and power reduction, not obtainable with conventional structures. The resulting devices have enhancement ratios of at least one.

22 Claims, 9 Drawing Figures

ULTRALOW-POWER, MICRO-MINIATURIZED JOSEPHSON DEVICES HAVING HIGH INDUCTANCE

BACKGROUND OF THE INVENTION

The present invention relates to superconductive devices employing Josephson tunneling junctions.

Josephson tunneling junctions are based upon the coupling of macroscopic quantum states in two superconductors separated by an extremely thin potential barrier. When a predetermined junction current threshold is exceeded, or a magnetic field is applied in the vicinity of a junction through which a supercurrent is flowing, it switches abruptly from a zero voltage state to a finite voltage state, $2\Delta/e$, the energy gap voltage of the junction. The magnetic flux may be supplied by one or more control elements, which are conductors overlying the junction, but separated therefrom by an insulator which is too thick to support tunneling. In addition to performing switching functions, Josephson tunnel junctions can perform memory functions by storing magnetic flux in quantized units; cf. Zappe, "A Single Flux Quantum Josephson Junction Memory Cell," *Applied Physics Letters*, Vol. 25, pp. 424–426 (Oct. 1, 1974), and Gueret, "Experimental Observation of the Switching Transients Resulting from Single Flux Quantum Transitions in Superconducting Josephson Devices," ibid., pp. 426–428. Memory applications rely upon the existence of many overlapping modes, called vortex modes, first described by Owen and Scalapino in *Physical Review*, Vol. 164, pp. 538–544 (Dec. 10, 1967).

Superconducting interferometer structures, comprising at least a pair of Josephson junctions interconnected in a superconducting loop, are known to exhibit many properties similar to those of individual junctions. In particular, switching and flux-storage functions can be performed with interferometers, in much the same manner as with individual junctions, the primary difference being that in an interferometer the applied magnetic field is chiefly coupled to the superconducting loop rather than to the junctions. For a given device size the coupling mechanism of an interferometer allows a greater sensitivity to a given magnetic field than is obtainable with an individual tunnel junction of the same total dimensions; for this reason interferometers appear very attractive from a miniaturization point of view.

As with other electronic devices made in integrated form, it is desirable to reduce the size and power dissipation of Josephson devices as much as possible. However, certain effects have imposed limits to size and power reductions. To store a single flux quantum in an interferometer, it is necessary that $$L I_o \simeq \Phi_o$$

where $L$ is the loop self inductance, $I_o$ is the maximum supercurrent of the total structure, and the flux quantum is $\Phi_o = h/2e = 2.07 \times 10^{-15}$ Weber. Thus, if the current level is decreased in attaining smaller size and power levels, the maintenance of the ability to store a flux quantum requires that the loop inductance be increased.

The conductors in such structures are conventionally treated as striplines whose inductance is proportional to the ratio of length to width. Miniaturization of a stripline allows the total inductance to remain constant, since length and width may be reduced proportionately. However, the capacitance, $C$, of a stripline is proportional to the product of length and width. Hence, capacitance decreases with miniaturization, and the characteristic impedance, proportional to the square root of the ratio of inductance to capacitance, increases. Moreover, Josephson junctions are essentially constant-voltage devices; the voltage drop $2\Delta/e$ being independent of the junction size. Hence, current levels in Josephson circuits decrease naturally as the circuits are miniaturized. In addition, for a given Josephson current density, the maximum supercurrent which may be passed through a junction decreases as junction dimensions are decreased. For these reasons, the current, $I_o$, and the product $L I_o$ decrease with smaller device sizes. A point is ultimately reached where a single flux quantum can no longer be sustained. This has previously appeared to impart fundamental limitations to the miniaturization and power reduction of superconducting, interferometer devices.

Apart from the factors which show the need for more inductance as devices grow smaller, it should be appreciated that the phenomenon of "kinetic inductance" has been seen in connection with experiments on thin films. It was discovered that inductance could be enhanced by making the thickness of the film less than the superconducting penetration depth ($\lambda$) of the film at superconducting temperatures. This phenomenon was first reported in the "Proceedings of the Symposium on the Physics of Superconducting Devices," April 1967, U. of Va., Charlottesville, Va., in a paper by W. A. Little entitled "Device Application of Super-Inductors."

Typical prior art interferometer structures are discussed in *Physical Review*, Vol. 140, No. 5A, Nov. 29, 1965, p.A1628 in an article entitled "Macroscopic Quantum Interference in Superconductors" by R. C. Jaklevic et al, and in *Physical Review B*, Vol. 6, No. 3, Aug. 1, 1972, p. 855 in another article entitled "Quantum Interference Properties of Double Josephson Junctions" by T. A. Fulton et al. The structures shown do not affirmatively incorporate the use of kinetic inductance and, to the extent that a hindsight view of these structures might suggest that such teaching was accidentally incorporated or utilized as a correction factor, the enhancement ratios obtained are always less than one.

Summary of the Invention

The present invention proposes Josephson interferometer structures which overcome the above mentioned apparent limitations by employing the property of kinetic inductance to increase the self inductance of such structures, thereby allowing reductions in size and power beyond those thought possible in the prior art.

Briefly stated, the present invention provides devices having a superconducting loop including at least two superconductors separated by a pair of barriers. The barriers form Josephson tunneling junctions. At least one of the superconductors interconnecting the junctions has a thickness substantially less than its superconducting penetration depth, for the purpose of increasing the loop self inductance. Current is supplied to the total structure (interferometer) directly via two electrodes whereas the voltage state of the component junctions and the flux-storage state of the loop are controlled by signals in one or more control lines which inductively couple to the loop. The resulting structures have enhancement ratios, as defined hereinbelow, of at least 1.

Other aspects and advantages of the invention, as well as modifications obvious to those skilled in the relevant arts, will be appreciated from the following description of several preferred embodiments thereof.

DESCRIPTION OF THE PREFERRED EMBODIMENTS

Figure 1:
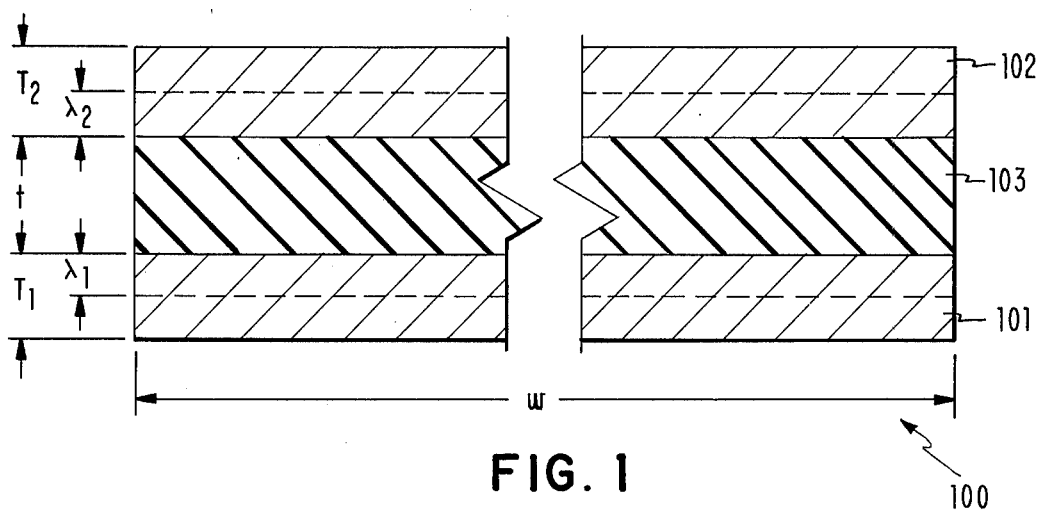
FIG. 1 is an end view of a superconducting stripline structure useful in explaining the concepts of the invention.

FIG. 1 shows an end view of a structure 100 (not drawn to scale) having two superconductor layers 101 and 102 separated by an insulator 103. The width of the structure is $w$, and the total thickness of superconductors 101 and 102 are $T_1$ and $T_2$, respectively. The insulator thickness is denoted by $t$. Then, as shown in Chapter 6 of R. E. Matick, *Transmission Lines for Digital and Communication Networks* (McGraw Hill, 1969), the total inductance per unit length, $L_T$, of structure 100 is:

$$L_T = \frac{\mu_o}{w} (t + \lambda_1 \coth(T_1/\lambda_1) + \lambda_2 \coth(T_2/\lambda_2)) \quad (1)$$

where $\lambda_1$ and $\lambda_2$ are the superconducting penetration depths in elements 101 and 102, respectively. The scalar permeability is denoted by $\mu_o$.

The second and third terms of the above equation represent the inductance effects due to the superconductor thicknesses. For conductor thicknesses greater than about three times the respective penetration depths, the inductance per unit length $L_1$, of equation (1) may be approximated by $$L_{T_o} \equiv \frac{\mu_o t}{w} \left(1 + \frac{\lambda_1 + \lambda_2}{t}\right) \equiv L_M \left(1 + \frac{\lambda_1 + \lambda_2}{t}\right) \quad (2)$$

where $L_M$ is the normal magnetic inductance (per unit length) of the structure. (It should be appreciated that all interferometer structures possess a kinetic inductance factor which is a function of the penetration depth and the oxide thickness but that this relationship does not take into consideration the much larger effect which can be achieved when the penetration depths become larger than the actual thicknesses of the conductors involved. No one has recognized that by reducing the thickness of at least one of the layers of an interferometer structure, one can convert what is generally a de minimus effect in known structures into a predominating effect in the structures of the present application.) The inductance contribution due to finite superconductor thicknesses is small in this case. But, at the opposite extreme, where superconductors 101 and 102 are made much thinner than (e.g., less than about one-third) their respective penetration depths, the superconductor contributions are enhanced and consequently can dominate the normal magnetic inductance, $L_M$, and thus:

$$L_T \approx \frac{\mu_o}{w} \left(t + \frac{\lambda_1^2}{T_1} + \frac{\lambda_2^2}{T_2}\right) \quad (3)$$

This "kinetic inductance" phenomenon, which applies to all superconducting materials, may be employed to produce a substantial increase in the total self inductance, $L$, of practical devices.

For the purposes of this application, two further quantities having units of inductance per unit length and defined, which relate to the above inductances as follows:

Let $$L_\infty \equiv L_M \left(1 + \frac{\lambda_1 + \lambda_2}{t}\right) \quad (4)$$

where $L_\infty$ is the inductance of a structure wherein the thicknesses of the superconductors are very large relative to the penetration depths $\lambda_1$, $\lambda_2$, and $L_M$ is the normal magnetic inductance. Then, that portion of the total inductance which arises from the kinetic inductance enhancement when one or both of the superconductor thicknesses is smaller than its superconducting penetration depth is defined as $$L_K \equiv L_T - L_\infty \quad (5)$$

The ratio, $L_K/L_\infty$, is one way of expressing the degree of enhancement of the total self inductance due to making one of the superconductor thicknesses less than its penetration depth. This ratio is relevant to the present teaching in that it represents a precise way of distinguishing the present structures from conventional interferometers. Generally speaking, for devices in which the kinetic inductance contribution is relatively large, the ratio $L_K/L_\infty$ is large; on the other hand, when the normal magnetic inductance, $L_M$, dominates the ratio is small (typically much less than 1).

Figure 2:
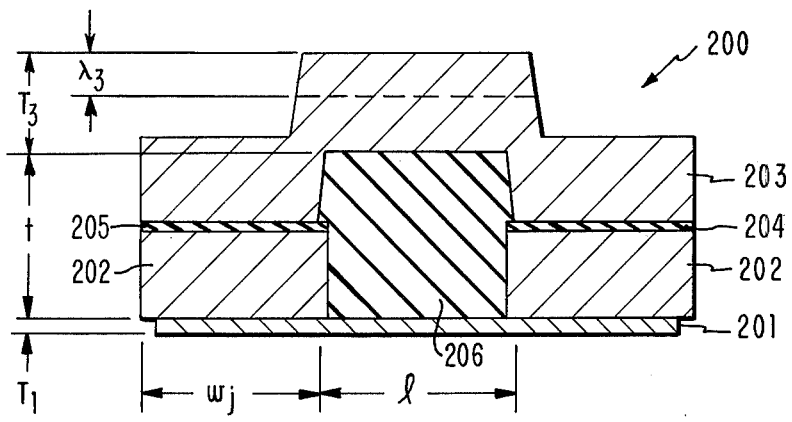
FIG. 2 is a side view of a Josephson interferometer device constructed according to the present invention.
Figure 3:
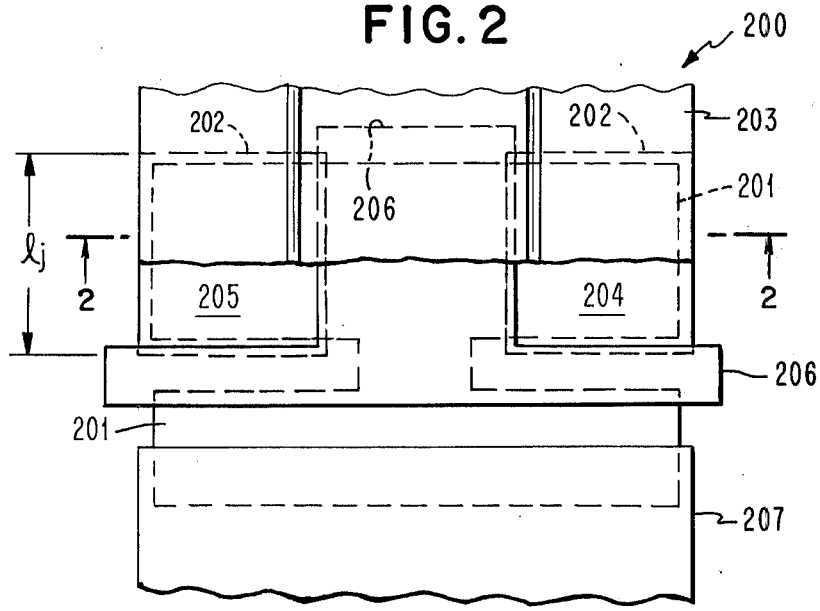
FIG. 3 is a top view of the device shown in FIG. 2.

FIGS. 2 and 3 illustrate one type of Josephson junction interferometer device 200 according to the invention. Device 200 has three superconductor layers 201–203, and two tunnel junctions formed by the conductors 202,203 and the tunnel barrier oxides 204,205, respectively. Numeral 206, FIG. 3, denotes an insulating layer between portions of conductors 201,203. Numeral 207 represents an external electrode connected to conductor 201. The self inductance of device 200 is due primarily to the stripline structure (similar to that shown in FIG. 1) formed by superconductors 201,203, and insulator 206.

Superconductors 202 and 203 may be thicker than their penetration depths, as shown by the relative distances $T_3$ and $\lambda_3$ for conductor 203, in FIG. 2. Conductor 201, however, is very thin, and is engineered to have a large penetration depth and a very small critical thickness. For a superconductor in which $m \ll \xi_o$, wherein $m$ is the electronic means free path and $\xi_o$ is the zero temperature coherence length, the effective London penetration depth, $$\lambda \approx \lambda_L \left(\frac{\xi_o}{m}\right)^{\frac{1}{2}} \left[1 - \left(\frac{T}{T_c}\right)^4\right]^{-\frac{1}{2}} \quad (6)$$

where $\lambda_L$ is the London penetration depth at absolute zero and $T_c$ is the critical temperature. Hence for a fixed operating temperature, $T$, $\lambda$ can be increased by either decreasing $m$ and/or $T_c$. The factor $m$ can be decreased, for example, by including impurities or by intentionally damaging the crystal lattice by ion bombardment. Conductor 201 may, for example, be a layer composed of suitably treated niobium having $T_1 = 50A$, and $\lambda_1 = 2000A$. Conductor 203 may be of conventional design having $T_3 = 5000A$, and $\lambda_3 = 800A$. The junction dimensions and the loop length may then be made very small, such as $l_j = w_j = l = 1$ micrometer. With an insulator thickness $t = 8000$ A and these parameter values, the inductance per unit length (using equation (1) and recognizing that only $\lambda_1$ is greater than $T_1$, while $\lambda_3$ is less than $T_3$) is approximated by $$L_T \approx \frac{\mu_o}{w}\left(t + \lambda_3 + \frac{\lambda_1^2}{T_1}\right)$$

with $w = l_j$, and the total inductance is $L = l \cdot L_T = 11.2$ picohenries (pH). The current required to sustain a flux quantum then becomes (approximately) $I_o = \lambda \Phi_o/L = 0.19$mA. For a junction having voltage drop $2\Delta/e = 2.5$mV, the maximum power dissipation is $P = I_o \cdot 2\Delta/e = 0.48$ microwatt. The "enhancement ratio," $L_K/L_\infty$, as defined previously, is equal to 7.2 for this example. Another factor of two improvement can be obtained by replacing conventional superconductor 203 with a thin conductor such as 201.

By way of comparison, a conventional thickness (for devices which did not apprehend the inclusion of kinetic inductance at all) for conductor 201 would be on the order of 4000A, with a penetration depth of about 800A. Using the approximation for thick conductors, such a device would have a total inductance of only 1.21pH, and therefore a minimum current of 1.71mA, for the same junction and loop dimensions. The power dissipation of such a device would be 4.3 microwatts, i.e., nine times as great as the improved structure. The enhancement ratio in this case is very small, $L_K/L_\infty = 8.1 \times 10^{-6}$. Alternatively, to achieve the same power dissipation as the improved structure, a conventional structure for superconductor 201 would require a loop length $l = 9.25$ micrometers. Conventional interferometers, because they did not appreciate the utility of kinetic inductance (indeed interferometers were known prior to the teaching of kinetic inductance), always have enhancement ratios less than 1. Even more recent prior art interferometer structures have an enhancement ratio less than 1.

Figure 4:
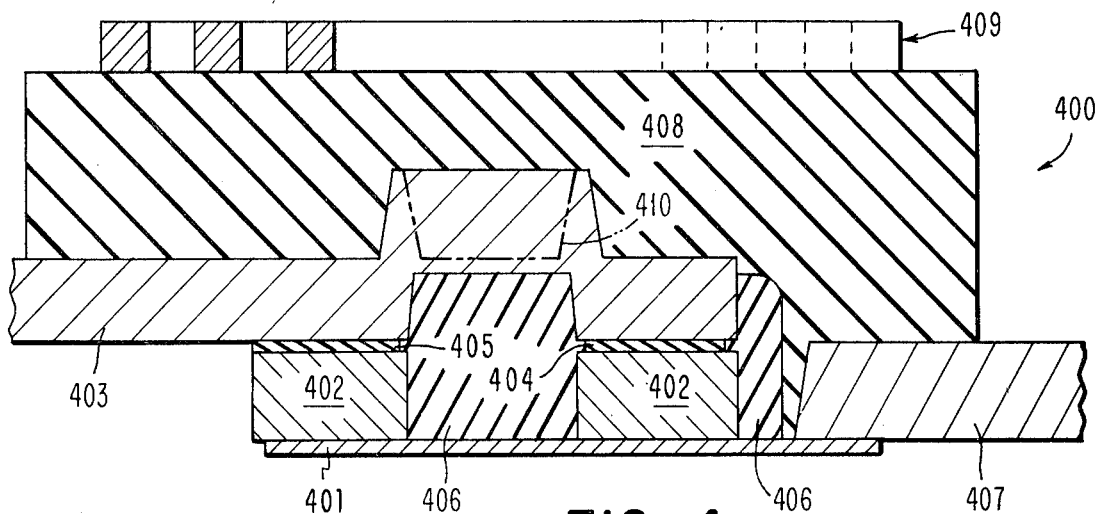
FIG. 4 is a side view of a multi-control Josephson device constructed according to the invention.

FIG. 4 is a side view of a Josephson device 400 similar to that shown in FIGS. 2 and 3, but also including additional elements, so as to form an antisymmetric multi-control gate.

Figure 5:
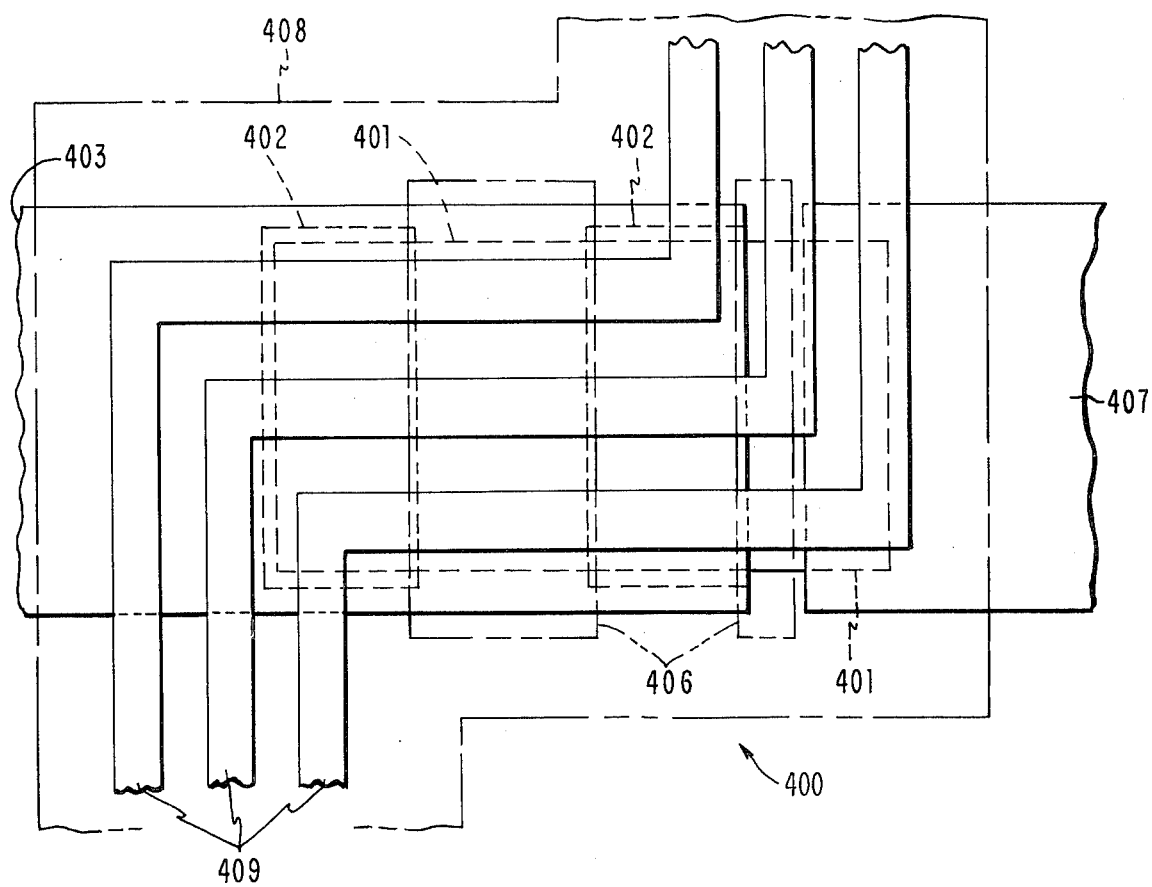
FIG. 5 is a top view of the device shown in FIG. 4.

Superconducting layer 401 has a small thickness and a large penetration depth, as does conductor 201 in the previously described device. Layers 402 and 403, and barrier insulation 404 and 405, correspond respectively to elements 202–205 in FIGS. 2 and 3. Conductors 403 and 407, which latter element is connected directly to layer 401, form electrodes for connecting opposite sides of the junctions to other devices (not shown). Again, layer 403 may be either a relatively thick, low-penetration superconductor, or it may be a thin, high-penetration layer similar to layer 401, for further self-inductance enhancement. Insulation layer 406, shown schematically in FIG. 5, forms the insulating layer between layers 401 and 403. Insulating layer 408 lies atop conductors 403 and 407. In practice, layers 406 and 408 extend across many devices fabricated on the same substrate.

Three mutually isolated coplanar control lines 409 overlie insulator 408 in a layer to provide current for switching the voltage state or the flux-storage state of the interferometer device 400. The operation of such interferometer gates is similar to that of individual Josephson gates such as described in, e.g., Matisoo, "The Tunneling Cryotron — A Superconductive Logic Element Based on Electron Tunneling," *Proceedings of the IEEE*, Vol. 55, pp. 172–180 (February 1967). Very briefly, when the algebraic sum of the currents in control lines 409 exceeds a threshold determined by device geometry, the device voltage switches abruptly from zero to $2\Delta/e$, i.e., the energy gap voltage of the particular superconducting materials employed. Device 400 is therefore suitable for the implementation of symmetric switching functions, such as threshold or Boolean logic. As with device 200, a factor of two improvement in inductance can be obtained by removing that portion of layer 403 bounded by phantom line 410 in FIG. 4.

The dimensions of device 400 may be similar to those of device 200, in which case the width of each control line may be on the order of 0.17 micrometer. When the sum of the currents is sufficient, the resulting magnetic field which couples to the interferometer induces a circulating current in the loop which switches the junctions. For single-control-line structures, the device dimensions may be made even smaller by using materials with a greater penetration depth. For example, let the junction length and width, the insulator (406) thickness, and the loop length all be 1000A; the total device area is then $3 \times 10^{-10}$cm$^2$. Then, if superconductors 401 and 403 are both fabricated from 50A thick layers of superconducting material and have a penetration depth of 6000A, the total inductance becomes $L = 181$ picohenries, the current to sustain a flux quantum is $I_o = 11.4$ microamperes, and the power dissipation is P = 0.029 microwatt. The enhancement ratio in this case is $L_K/L_\infty = 109$. The passage of the current, $I_o$, through junctions of such dimensions corresponds to a current density of $5.7 \times 10^4$ A/cm$^2$. Such a current value is still reasonably far away from fundamental intrinsic noise limitations; stable operation requires that $I_o >> (e/\hbar) kT \approx 0.1$ microampere, where $e$ is the electron charge, $\hbar = h/2\pi$, $h$ is Planck's constant, $k$ is Boltzmann's constant and T is the absolute temperature. The above dimensions approach the foreseeable limits of microminiaturization with electron-beam techniques.

Structures 200 and 400 provide small, low-power devices which can perform a great variety of logic and memory functions, as well as other switching and detecting functions. The structures are compatible with the high characteristic impedances which arise naturally as linewidths are miniaturized. The structures are compatible with both floating groundplane and fixed ground-plane arrangements. The material for the thin superconductors 201 and 401 may be selected and fabricated independently of the junction and control line materials. The devices employ junctions in which the current distribution is uniform and for which the $l_j/\lambda_j$ ratio is irrelevant, where $\lambda_j$ is the Josephson penetration depth. In such circumstances, there are no restrictions on junction length other than what is technologically feasible, thus enabling device dimensions to be much smaller than can be obtained with conventional devices.

While certain fabrication steps and materials have been alluded to hereinabove relative to the structure of the devices of FIGS. 1–4, specific fabrication steps have not been specifically indicated. The following procedure may be utilized in the fabrication of the devices disclosed hereinabove.

While not specifically shown in any of the figures, the devices of FIGS. 1–4 are usually formed on a substrate of sapphire or other non-conducting material. Referring again to FIG. 2, layer 201 of niobium or other appropriate superconducting material is deposited on the above mentioned substrate by vacuum evaporation or other deposition technique to a thickness of approximately 50A. The minimum thickness of superconducting material 201 is critical only to the extent that it be conductive or electrically continuous. The maximum thickness is limited by the fact that, to achieve the desired result, the thickness of the layer in question must be less than the superconducting penetration depth.

After the deposition of layer 201, superconducting layer 202 of a material such as lead or lead alloys is deposited on layer 201 to a thickness of about 4000A.

In a succeeding step, tunnel barrier oxides 204,205 are formed to the desired thickness (in the order of 30A) by R-F plasma oxidation using a technique shown in U.S. Pat. No. 3,849,276, issued Nov. 19, 1974 to J. M. Greiner et al, and assigned to the same assignee as the present invention. Alternatively, thermal oxidation of layer 202 may be carried out to the desired thickness.

Layer 206 of silicon oxide is formed by vapor deposition in a manner well known to those skilled in the deposition art. Layer 206 is delineated by well-known photolithographic masking and etching techniques.

Counterelectrode layer 203 of superconducting material such as lead or a lead alloy is formed by vacuum deposition or other appropriate technique to a thickness of approximately 5000A.

In subsequent steps as shown in FIG. 4, a layer of silicon oxide 408 is formed in the same manner as layer 206.

Next, interconnection 207 of superconducting metal such as lead or a lead alloy is formed by vacuum deposition to overlie a portion of layer 201 which has been exposed. Simultaneously, the deposition of a control line over counterelectrode 203 is formed.

Figure 6:
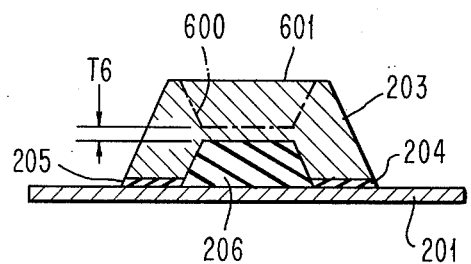
FIG. 6 shows an alternative structure in cross-section which eliminates portions of the devices shown in FIGS. 2, 4. A phantom line defines the configuration of the upper conductor which is obtained by etching and anodizing or a combination thereof in an alternative structure.

Referring now to FIG. 6, there is shown therein an alternative structure in cross-section which eliminates portions of the devices shown in FIGS. 2, 4. In addition, a phantom line 600 shows the boundary of a region of the upper layer which may be removed by etching, anodizing or a combination thereof. Thus, the device of FIG. 6 is similar to the device of FIG. 2 except that superconductors 202 have been eliminated. Superconductor layer 203, in FIG. 6, is formed directly over tunnel barrier oxides 204,205 and insulating layer 206. As in FIG. 2, conductor 201 is very thin and is engineered to have a large penetration depth and a very small critical thickness. In other words, the penetration depth $\lambda$ must be very much greater than the actual thickness of layer 201. In FIG. 6, phantom line 600 shows the extent to which a portion 601 of conductor 600 may be removed to provide a member having a kinetic inductance similar to that of conductor 201. Thus, by masking using well-known photolithographic techniques and etching or sputtering, portion 601 may be removed providing an upper conductor portion having a thickness T6 which is approximately the same thickness as conductor 201. Upper conductor portion of thickness T6, like conductor 201, has a penetration depth greater than the thickness of the layer.

Figure 7:
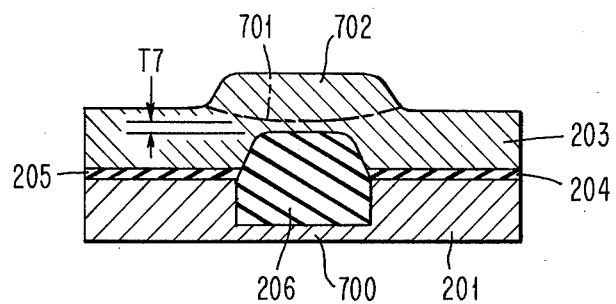
FIG. 7 shows still another structure in cross-section which incorporates the teaching of the present invention. Sputter etching and oxide deposition provide a device which utilizes only two superconductive layers. Here, also, a phantom line defines an alternative configuration for the upper conductor which can be obtained in a manner similar to that described in connection with FIG. 6.

FIG. 7 shows in cross-section a structure similar to that shown in FIG. 6 except that layer 201 is very much thicker than that shown in FIG. 2. However, layer 201 has a portion 700 having a thickness which is the same as the thickness of layer 201 in FIG. 2. In this manner, a kinetic inductance identical with that provided by layer 201 of FIG. 2 is provided by portion 700 of layer 201 of FIG. 7. In FIG. 7, portion 700 of layer 201 may be obtained by masking and sputter etching in a manner well known to those skilled in that art. After etching, insulating layer 206 of silicon oxide or other appropriate material may be deposited in a well-known manner. After masking, insulating layer 206 is delineated and tunnel barrier oxides 204,204 are formed by well-known techniques. Layer 203 is then deposited by vacuum evaporation or other well-known techniques. In FIG. 7, phantom line 701 shows the extent to which a portion 702 of conductor 203 may be removed to form a region of thickness T7 which has the same thickness as layer 201 of FIG. 2 or portion 700 of FIG. 7. As previously indicated, the use of two elements having kinetic inductance provides an increase in the inductance available by approximately a factor of two.

Figure 8:
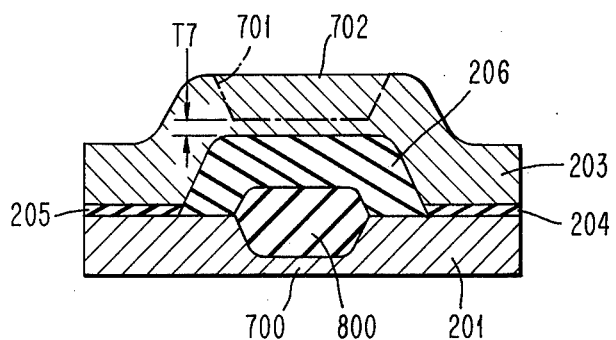
FIG. 8 shows yet another structure in cross-section which incorporates the teaching of the present invention. A phantom line indicates an alternative to the structure of the upper conductor.

FIG. 8 shows another structure in cross-section which provides kinetic inductance in accordance with the teaching of the present invention. FIG. 8 is similar to FIG. 7 except that a region 800 of niobium oxide is formed by anodization of conductor 201, leaving only a portion 700 undisturbed.

Figure 9:
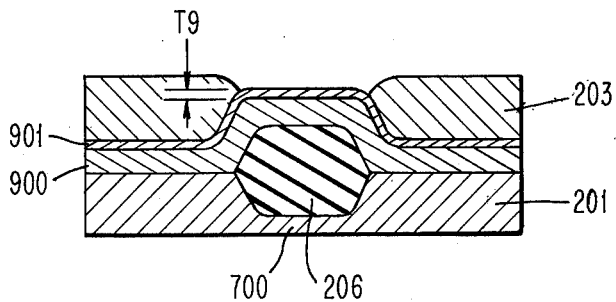
FIG. 9 shows an S-N-S (Superconductor-Normal Metal-Superconductor) structure which incorporates kinetic inductance in accordance with the teaching of the present invention.

FIG. 9 shows an S-N-S (Superconductor-Normal Metal-Superconductor) structure which incorporates kinetic inductance in accordance with the teaching of the present invention. Thus, portion 700 of layer 201 and insulator layer 206 are fabricated in the same manner as described in connection with FIG. 7. Thereafter, a layer 900 of a normal metal such as copper is deposited by vacuum deposition or other suitable technique over layer 201 and insulator layer 206. Then, a special thin layer 901 of superconducting metal is deposited atop layer 900. Layer 901 has a thickness T9 which is the same or similar to the thickness of portion 700 and provides kinetic inductance in the same manner as described hereinabove. Finally, layer 203 is formed atop layer 901. The portion over insulating layer 206 may be removed as shown in FIG. 9 without affecting the overall operation of the device. While the structures of FIGS. 6-9 show only the superconducting layers utilized to form the junctions of the interferometer and provide the required kinetic inductance, it should be obvious that one or more control lines similar to those shown in FIG. 4 may also be utilized in conjunction with each of the structure shown in FIGS. 6-9.

Having described several preferred embodiments thereof, I claim as my invention:

1. A superconductive device for operation at a constant temperature below the critical temperature, $T_c$, of the superconducting materials of said device comprising at least two Josephson tunneling junctions, and means for providing kinetic inductance interconnecting said at least two Josephson tunneling junctions wherein said kinetic inductance is the self-inductance in addition to the normal magnetic inductance when a material is superconducting, said device having an enhancement ratio, $L_K/L_\infty$, of at least one, at least a portion of said means having a thickness less than the London penetration depth, $\lambda$, thereof at absolute zero temperature,
    where $L_K$ is the difference between the total inductance, $L_T$, which said device would have at a temperature of absolute zero, and the inductance $L_\infty$ which said device would have at a temperature of absolute zero if the thickness of said at least a portion of said means and the remainder of said means were very large relative to said London penetration depth at absolute zero temperature.

2. A superconductive device according to claim 1 wherein said means for providing kinetic inductance includes at least a single superconductive element having a thickness less than its effective superconducting penetration depth, $\lambda$.

3. A superconductive device according to claim 1 wherein said means for providing kinetic inductance includes a pair of superconductive elements each having a thickness less than its effective superconducting penetration depth.

4. A superconductive device according to claim 1 wherein said means for providing kinetic inductance includes at least a single superconductive element at least a portion of which has a thickness less than its effective superconducting penetration depth.

5. A superconductive device according to claim 1 wherein said means for providing kinetic inductance includes a pair of superconductive elements at least a portion of each of said elements having a thickness less than its effective superconducting penetration depth.

6. A superconductive device according to claim 1 wherein said at least two Josephson tunneling junctions include upper and lower electrodes of superconducting materials at least one of said upper and lower electrodes including at least a portion of said means for providing said kinetic inductance.

7. A superconductive device according to claim 1 further including control means connected to said device for switching said Josephson tunneling junctions.

8. A superconductive device according to claim 1 wherein said means for providing kinetic inductance includes at least a single superconductive element at least a portion of which has a thickness less than its effective superconducting penetration depth and other portions of which form electrodes for said at least two Josephson tunneling junctions.

9. A superconductive device according to claim 7 wherein said control means includes at least a single conductor disposed in electromagnetically coupled relationship with said junctions and said means for providing kinetic inductance.

10. A superconductive device according to claim 2 wherein said at least a single superconductive element has a thickness of at most one-third its effective penetration depth.

11. A superconductive device according to claim 2 wherein said at least a single superconductive element has a thickness of at most one-fortieth its effective penetration depth.

12. A high inductance interferometer for operation at a constant temperature below the critical temperature, $T_c$, of the superconducting materials of said interferometer comprising at least two Josephson tunneling junctions and superconducting loop means interconnecting said at least two junctions,
    at least a portion of said loop means having a thickness less than the London penetration depth, $\lambda$, at absolute zero temperature,
    said interferometer having an enhancement ratio, $L_K/L_\infty$, of at least one, where $L_K$ is the difference between the total self-inductance, $L_T$, which said loop means would have at a temperature of absolute zero, and the inductance $L_\infty$ which said loop means would have at absolute zero temperature if the thickness of said at least a portion of said loop means and the remainder of said loop means were very large relative to said London penetration depth at absolute zero temperature.

13. A high inductance interferometer according to claim 12 wherein said at least two Josephson tunneling junctions include upper and lower electrodes of superconducting materials at least one of said upper and lower electrode forming a portion of said loop means.

14. A high inductance interferometer according to claim 12 wherein said loop means includes insulation disposed internally of said loop means.

15. A high inductance interferometer according to claim 12 further including control means connected to said device for switching said at least two Josephson tunneling junctions.

16. A high inductance interferometer according to claim 12 wherein the thickness of said at least a portion of said loop means is at most one-third its effective penetration depth.

17. A high inductance interferometer according to claim 12 wherein the thickness of said at least a portion of said loop means is at most one-fortieth its effective penetration depth.

18. A high inductance interferometer according to claim 15 wherein said control means includes at least a single conductor disposed in electromagnetically coupled relationship with said loop means.

19. A superconductive device for operation at a constant temperature below the critical temperature, $T_c$, of the superconducting materials of said device, comprising at least a pair of spaced apart Josephson tunneling barriers, first and second superconductive elements disposed adjacent said tunneling barriers forming Josephson tunneling devices, at least one of said elements having a thickness less than its London penetration depth, $\lambda$, at absolute zero temperature, said device having an enhancement ratio, $L_K/L_\infty$, of at least 1, where $L_K$ is the difference between the total self-inductance, $L_T$, which said device would have at absolute zero temperature and the inductance, $L_\infty$, which said device would have at absolute zero temperature if the thicknesses of said elements were very large relative to the London penetration depth thereof at absolute zero temperature.

20. A superconductive device according to claim 19 further including control means connected to said device for switching said Josephson tunneling devices.

21. A superconductive device according to claim 20 further including means for applying electrical energy to said tunneling devices and said control means.

22. A superconductive device according to claim 20 wherein said tunneling barrier is a normal metal

* * * * *